United States Patent

Fukunaga et al.

[11] Patent Number: 5,922,137
[45] Date of Patent: Jul. 13, 1999

[54] METHOD OF PRODUCING A SEMICONDUCTOR WAFER AND A CLEANING APPARATUS FOR THE SAME

[75] Inventors: Hisaya Fukunaga; Katsutoshi Kurogi, both of Kanagawa, Japan

[73] Assignee: Komatsu Electronic Metals Co., Ltd., Kanagawa, Japan

[21] Appl. No.: 08/884,851

[22] Filed: Jun. 30, 1997

[30] Foreign Application Priority Data

Jun. 29, 1996 [JP] Japan .................................. 8-204067

[51] Int. Cl.[6] .............................. C03C 23/00; B08B 7/00; B08B 9/00
[52] U.S. Cl. ................................ 134/2; 134/4; 134/22.19; 134/40
[58] Field of Search ................................ 134/2, 4, 22.19, 134/40

[56] References Cited

U.S. PATENT DOCUMENTS

| | | | |
|---|---|---|---|
| 3,128,213 | 4/1964 | Gault et al. | 156/17 |
| 3,936,328 | 2/1976 | Nakata | 148/171 |
| 4,372,788 | 2/1983 | Lancz | 134/4 |
| 4,501,258 | 2/1985 | Dyer et al. | 125/13 R |
| 5,599,438 | 2/1997 | Shiramizu et al. | 205/746 |
| 5,674,827 | 10/1997 | Kawashima et al. | 510/365 |
| 5,762,779 | 6/1998 | Shiramizu et al. | 205/746 |

*Primary Examiner*—Jill Warden
*Assistant Examiner*—Yolanda E. Wilkins
*Attorney, Agent, or Firm*—Sughrue, Mion, Zinn, Macpeak & Seas, PLLC

[57] ABSTRACT

A method of producing a semiconductor wafer in which a semiconductor wafer cut by a wire saw can be cleaned efficiently and in automatic steps and abrasive grains are substantially completely removed away, and a cleaning apparatus for the method are provided. A semiconductor ingot is cut by a wire saw into cut semiconductor wafers. Each of the cut semiconductor wafers is degrease-cleaned, the semiconductor wafer which has been degrease-cleaned is oil-water separation-cleaned, the semiconductor wafer which has been oil-water separation-cleaned is rinsed, abrasive grains are removed away from the surface of the semiconductor wafer which has been rinse-cleaned, by alkali cleaning, the semiconductor wafer which has been abrasive grain removal-cleaned is separated from a slicing plate.

10 Claims, 2 Drawing Sheets

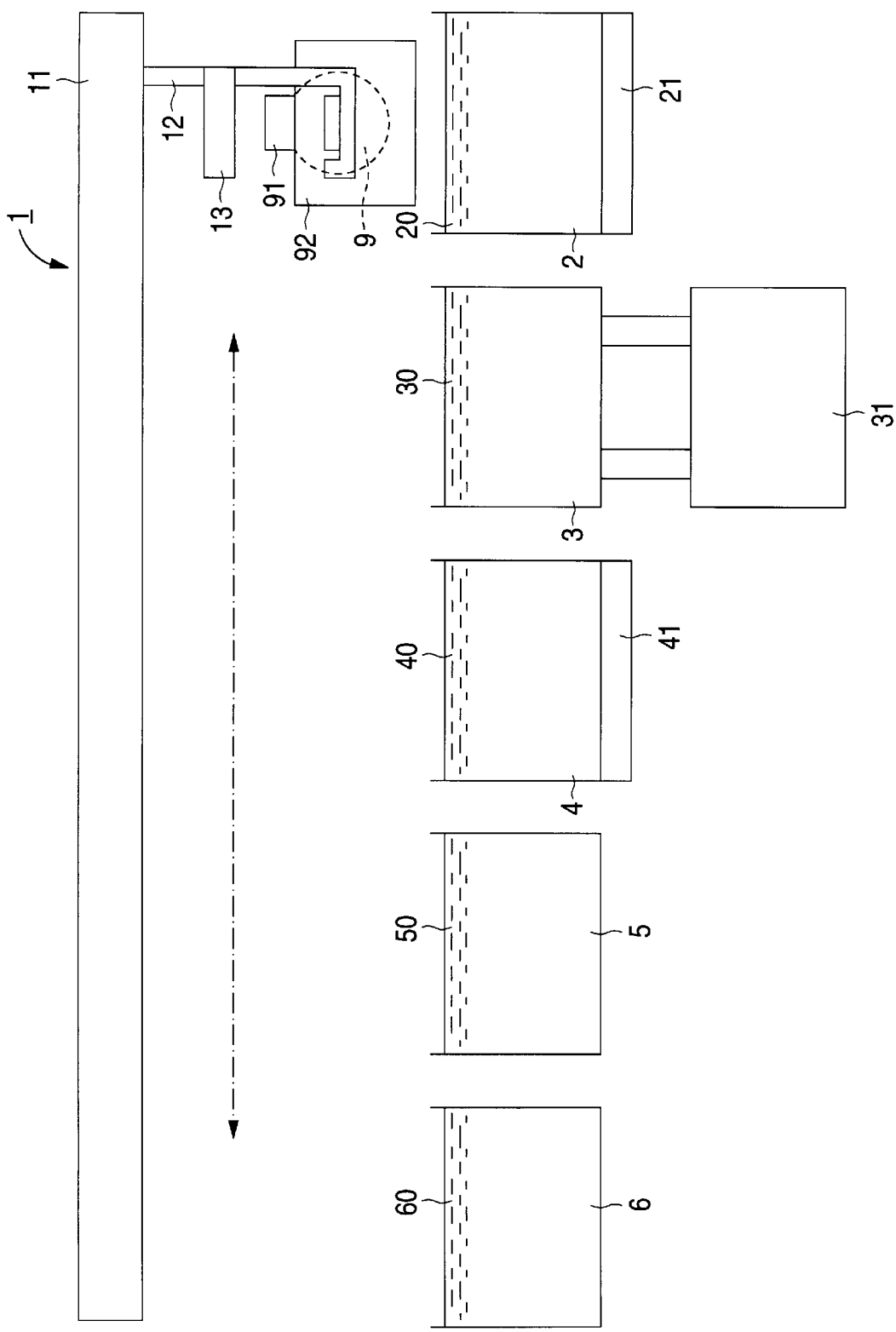

METHOD OF PRODUCING A SEMICONDUCTOR WAFER AND A CLEANING APPARATUS FOR THE SAME

BACKGROUND OF THE INVENTION

1. Field of the Invention

The invention relates to a method of producing a semiconductor wafer in which grease components and abrasive grains are removed away from a semiconductor wafer cut by a wire saw and the semiconductor wafer is separated from a carbon slicing plate, thereby obtaining a sliced wafer, and also to a cleaning apparatus for the method.

2. Prior Art

Recently, a wire saw is rapidly becoming widespread in the process of cutting a semiconductor ingot of a larger diameter such as 8 inches or 12 inches. Semiconductor wafers which have been cut by a wire saw are cleaned while the wafers are arranged in a row and peripheral portions of the wafers are bonded to a slicing plate made of carbon, thereby removing away grease components and abrasive grains which have adhered to the semiconductor wafers during the cutting process.

Conventionally, the cleaning work is conducted while using a single cleaning bath and replacing cleaning fluids with one other, or while moving among plural cleaning baths. The replacing or moving work must be manually conducted.

In order to separate the semiconductor wafers from the slicing plate, the semiconductor wafers which have been rinse-cleaned are immersed together with the slicing plate into, for example, an alkaline detergent containing 3.0% or more of an anionic surface active agent, thereby conducting a separating work.

The works which are manually conducted have problems in that they are low in efficiency, and that the human body may be adversely affected by chemical fluids and the like.

Abrasive grains which are on the surface of each semiconductor wafer are removed away as a result of the cleaning steps previous to and including the rinse-cleaning step. However, abrasive grains entering strain layers produced in the cutting work cannot be removed away. When the semiconductor wafers are separated from the slicing plate without subjecting the wafers to a further process, there arises a problem in that the abrasive grains in strain layers are brought into the subsequent step.

SUMMARY OF THE INVENTION

The invention has been conducted in view of the problems discussed above. It is an object of the invention to provide a method of producing a semiconductor wafer in which a semiconductor wafer cut by a wire saw can be cleaned efficiently and in automatic steps and abrasive grains are substantially completely removed away, and also a cleaning apparatus for the method.

According to the invention, the method of producing a semiconductor wafer comprises the steps of: cutting a semiconductor ingot by a wire saw; degrease-cleaning a cut semiconductor wafer; oil-water separation-cleaning the semiconductor wafer which has been degrease-cleaned; rinsing the semiconductor wafer which has been oil-water separation-cleaned; removing abrasive grains from a surface of the semiconductor wafer which has been rinse-cleaned, by alkali cleaning; and separating the semiconductor wafer which has been abrasive grain removal-cleaned, from a slicing plate.

The apparatus for cleaning a semiconductor wafer comprises: a degrease-cleaning bath in which a semiconductor wafer which has been cut by a wire saw is degrease-cleaned; an oil-water separation-cleaning bath in which a surface of the semiconductor wafer which has been degrease-cleaned is oil-water separation-cleaned; a rinse-cleaning bath in which the semiconductor wafer which has been oil-water separation-cleaned is rinsed; an abrasive grain removal-cleaning bath in which abrasive grains are removed away from the semiconductor wafer which has been rinse-cleaned, by alkali cleaning; a separation-cleaning bath in which the semiconductor wafer from which abrasive grains have been removed away is separated from a carbon slicing plate; a transporting device which sequentially transports the semiconductor wafer to the cleaning baths; and an air blower which blows air to the semiconductor wafer which has been lifted up from at least one of the cleaning baths, a process for each of the cleaning baths being automatically controlled.

In the method of producing a semiconductor wafer according to the invention, before the semiconductor wafer cut by a wire saw is separated from the slicing plate, abrasive grains adhering to the surface of the semiconductor wafer, particularly abrasive grains in strain layers produced in the cutting work are removed away by alkali cleaning, thereby preventing the abrasive grains from being brought into the subsequent step.

In the removal of abrasive grains, an alkaline cleaning fluid is used. When the cleaning rate is excessively high, the semiconductor wafer may be separated from the slicing plate before the removal of abrasive grains is sufficiently conducted. In order to prevent this phenomenon from occurring, an alkaline aqueous solution containing 0.5% to 3.0% of an anionic surface active agent is used in the alkali cleaning, and the temperature of the solution is set to be 50° C. to 90° C.

An object of the invention is to automatize the work of cleaning a semiconductor wafer cut by a wire saw, so that the work can be conducted efficiently and safely. To comply with this, cleaning baths in which the cleaning steps are to be respectively conducted are separately disposed, and a semiconductor wafer is sequentially automatically transported to the cleaning baths.

BRIEF DESCRIPTION OF THE DRAWINGS

FIG. 2 is a diagrammatic view showing the apparatus for cleaning a semiconductor wafer according to the invention.

DESCRIPTION OF THE PREFERED EMBODIMENT

Figure 1:
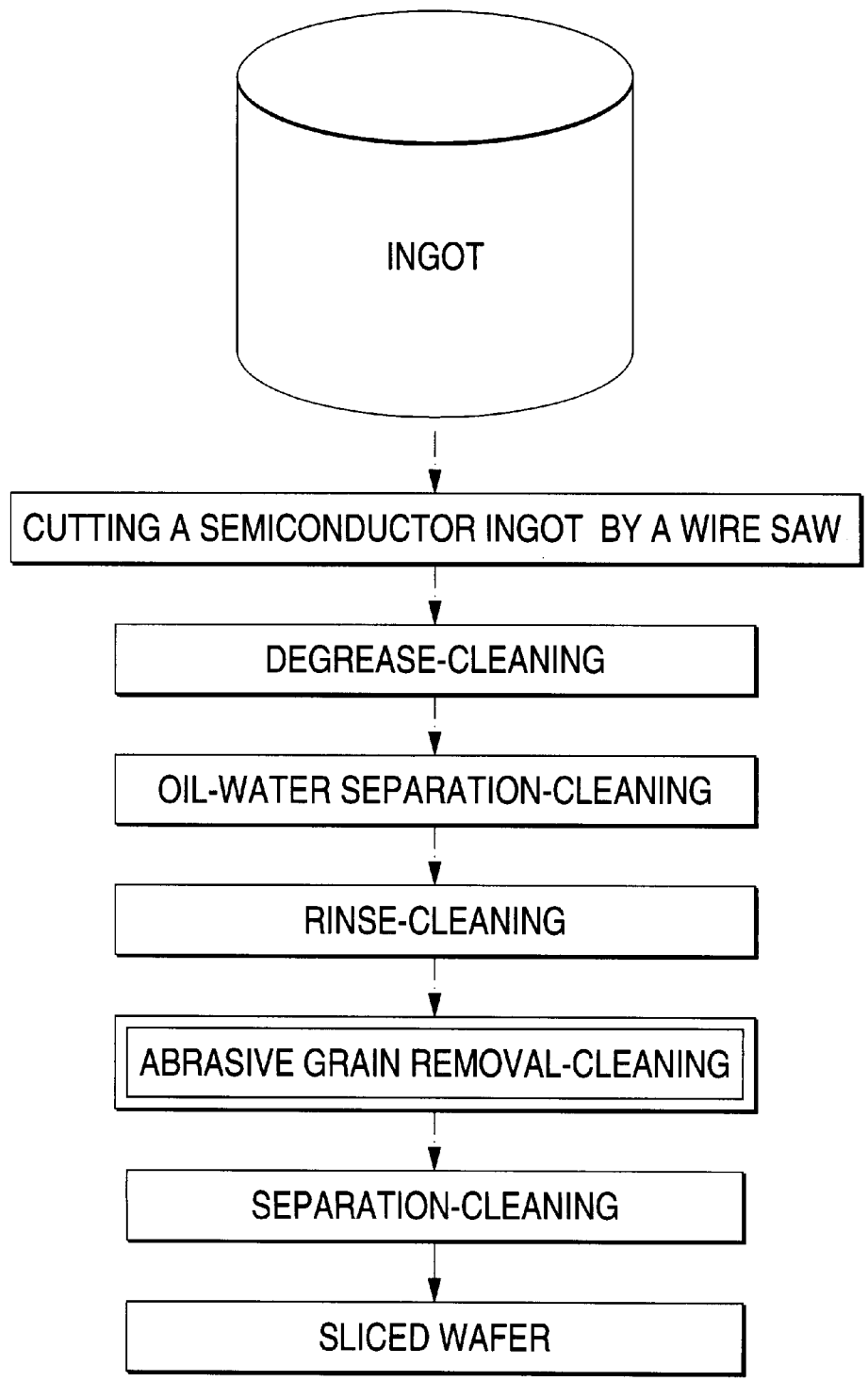
FIG. 1 is a flowchart showing the method of producing a semiconductor wafer according to the invention.

Hereinafter, an embodiment of the invention will be described with reference to the accompanying drawings.

FIG. 1 is a flowchart showing the method of producing a semiconductor wafer according to the invention, and FIG. 2 is a diagrammatic view showing the apparatus for cleaning a semiconductor wafer according to the invention.

First, the method of producing a semiconductor wafer of the embodiment will be described.

As shown in FIG. 1, in the embodiment, a semiconductor wafer is produced in the following steps:

(a) a cutting step of cutting a semiconductor ingot by a wire saw into a semiconductor wafer;

(b) a degrease-cleaning step of degrease-cleaning the semiconductor wafer;

(c) an oil-water separation-cleaning step of oil-water separation-cleaning the semiconductor wafer which has been degrease-cleaned;

(d) a rinse-cleaning step of rinsing the semiconductor wafer which has been oil-water separation-cleaned;

(e) an abrasive grain removal-cleaning step of removing abrasive grains from a surface of the semiconductor wafer which has been rinse-cleaned, by alkali cleaning; and (f) separation-cleaning step of separating the semiconductor wafer which has been abrasive grain removal-cleaned, from a slicing plate.

The cleaning steps including and subsequent to the degrease-cleaning step are conducted by the cleaning apparatus described below.

As shown in FIG. 2, the cleaning apparatus of the embodiment comprises: a transporting device 1 which sequentially transports semiconductor wafers 9 cut by a wire saw to cleaning baths; a degrease-cleaning bath 2 in which the semiconductor wafers 9 are degrease-cleaned; an oil-water separation-cleaning bath 3 in which the surfaces of the semiconductor wafers 9 are oil-water separation-cleaned; a rinse-cleaning bath 4 in which the semiconductor wafers 9 are rinsed; an abrasive grain removal-cleaning bath 5 in which abrasive grains are removed away from the semiconductor wafers 9 by alkali cleaning; and a separation-cleaning bath 6 in which the semiconductor wafers 9 are separated from a carbon slicing plate 91.

The transporting device 1 is disposed so as to sequentially transport the semiconductor wafers 9 in a state where the wafers are loaded into a transporting basket 92, among the cleaning baths. The transporting device comprises: the transporting device body 11; a lifter 12 which is moved along the transporting device body 11 while holding the basket 92; and an air blower 13 which blows air to the semiconductor wafers 9 which have been lifted up from either of the cleaning baths. The cleaning process in each of the cleaning baths, the process of blowing air to the lifted semiconductor wafers, and the transportation among the cleaning baths are automatically controlled.

The semiconductor wafers 9 are loaded into the basket 92 while peripheral portions of the wafers are bonded to the carbon slicing plate 91 and the wafers are arranged in a row. The wafers are separated from the carbon slicing plate 91 in the separation-cleaning bath 6 in which the final cleaning is conducted.

The degrease-cleaning bath 2 in which the semiconductor wafers 9 are to be degrease-cleaned contains an aqueous solution of a nonionic surface active agent, as a degreasing cleaning fluid 20. The aqueous solution is set to be about 70° C. The degrease-cleaning is conducted while applying vibrations to the semiconductor wafers 9 by bubbles produced by a bubbling device 21 disposed below the degrease-cleaning bath 2 and an ultrasonic wave which is laterally applied. The cleaning agent causes grease components adhering to the surfaces of the semiconductor wafers 9 to be emulsified so that the grease components are easily separated.

The oil-water separation-cleaning bath 3 in which the surfaces of the semiconductor wafers 9 are to be oil-water separation-cleaned contains hot water 30 which is set to be about 70° C. The cleaning is conducted while applying vibrations to the semiconductor wafers 9 by an ultrasonic wave which is laterally applied, whereby grease components can be separated from the surfaces of the semiconductor wafers 9.

A grease component removing device 31 is coupled to the oil-water separation-cleaning bath 3. The hot water 30 in the oil-water separation-cleaning bath 3 is circulated and purified by the device, so that grease components separated from the surfaces of the semiconductor wafers 9 are then removed from the hot water 30. According to this configuration, the grease components are prevented from being brought into the subsequent rinse-cleaning bath 4.

The grease component removing device 31 may be of the film adsorption type, the precipitation type, the centrifugal separation type, or the like. In the embodiment, the film adsorption type is employed.

The rinse-cleaning bath 4 in which the semiconductor wafers 9 are to be rinsed contains hot water 40 which is set to be about 70° C. In the same manner as the degrease-cleaning in the degrease-cleaning bath 2, the rinse-cleaning is conducted while applying vibrations to the semiconductor wafers 9 by bubbles produced by a bubbling device 41 disposed below the bath 4 and an ultrasonic wave which is laterally applied. As a result of these steps, most of abrasive grains which have adhered to the surfaces of the semiconductor wafers 9 are removed away.

The semiconductor wafers 9 are disposed so that, when they are lifted up from each of the degrease-cleaning bath 2, the oil-water separation-cleaning bath 3, and the rinse-cleaning bath 4, air is then blown to the wafers by the air blower 13, thereby causing grease components and abrasive grains to drop off.

In the cleaning steps in the degrease-cleaning bath 2, the oil-water separation-cleaning bath 3, and the rinse-cleaning bath 4, the semiconductor wafers 9 are once lifted up from the respective baths at a timing which is at a substantially middle point of the cleaning period, and then subjected to a draining process. As a result, grease components holding abrasive grains between the semiconductor wafers 9 drop by gravity, and hence the cleaning is conducted more efficiently.

The semiconductor wafers 9 which have been cut by a wire saw have strain layers. Although grease components and abrasive grains adhering to the surfaces of the wafers are removed away as a result of the cleaning steps previous to and including the rinse-cleaning step, abrasive grains in such strain layers cannot be removed away. Consequently, abrasive grains in such strain layers are removed away by alkali cleaning.

The abrasive grain removal-cleaning bath 5 contains an alkaline aqueous solution containing 2% of an anionic surface active agent, as an alkaline cleaning fluid 50. The temperature of the fluid is set to be about 70° C. Under this setting, alkali cleaning is not rapidly conducted. Consequently, abrasive grains in strain layers are removed away, but the semiconductor wafers 9 are not separated from the carbon slicing plate 91.

The final bath of the separation-cleaning bath 6 contains an alkaline cleaning fluid 60 containing 4% of an anionic surface active agent, in order to separate the semiconductor wafers 9 from the carbon slicing plate 91. The temperature of the fluid is set to be about 95° C. The alkaline cleaning fluid 60 causes the adhesive agent for bonding the semiconductor wafers 9 and the carbon slicing plate 91 together, to easily dissolve, with the result that the semiconductor wafers 9 are separated from the plate.

The invention configured as described above can attain an effect that a semiconductor wafer cut by a wire saw can be cleaned efficiently and in automatic steps.

Furthermore, the invention can attain an excellent effect that abrasive grains in strain layers produced in a cutting work can be removed away, whereby the abrasive grains are prevented from being brought into the subsequent step.

What is claimed is:

1. A method of producing a semiconductor wafer, comprising:

(a) a cutting step of cutting semiconductor ingot by a wire saw into a semiconductor wafer;

(b) a degrease-cleaning step of degrease-cleaning the semiconductor wafer;

(c) an oil-water separation-cleaning step of oil-water separation-cleaning the semiconductor wafer which has been degrease-cleaned;

(d) a rinse-cleaning step of rinsing the semiconductor wafer which has been oil-water separation cleaned;

(e) an abrasive grain removal-cleaning step of removing abrasive grains from a surface of the semiconductor wafer which has been rinse-cleaned, by alkali cleaning; and (f) separation-cleaning step of separating the semiconductor wafer which has been abrasive grain removal-cleaned, from a slicing plate, wherein the abrasive grain removal-cleaning step is performed by using an alkaline aqueous solution containing 0.5% to 3.0% of an anionic surface active agent as a cleaning fluid of the alkali cleaning for abrasive grain removal.

2. The method of producing a semiconductor wafer according to claim 1, wherein the abrasive grain removal-cleaning step is performed by setting a temperature of the cleaning fluid of the alkali cleaning for abrasive grain removal within a range between 50° C. and 90° C.

3. The method of producing a semiconductor wafer according to claim 1, wherein further comprises an air blow step of blowing air to the semiconductor wafer which has been lifted up from at least one of cleaning baths.

4. The method of producing a semiconductor wafer according to claim 1, wherein at least one of the degrease-cleaning step and the rinse-cleaning step, is conducted while performing bubbling.

5. The method of producing a semiconductor wafer according to claim 1, wherein at least one of the degrease-cleaning step and the oil-water separation-cleaning step has a lifting step of lifting up the semiconductor wafer once from the cleaning bath and then draining from the semiconductor wafer.

6. A method of producing a semiconductor wafer, comprising the steps of:

(a) providing a semiconductor ingot on a slicing plate and cutting a semiconductor ingot by a wire saw into a semiconductor wafer;

(b) degrease-cleaning the semiconductor wafer by dipping the semiconductor wafer and the slicing plate in a degrease-cleaning solution;

(c) oil-water separation-cleaning the semiconductor wafer by dipping the semiconductor wafer and the slicing plate in a separation-cleaning solution;

(d) rinsing the semiconductor wafer by dipping the semiconductor wafer and the slicing plate in a rinsing solution;

(e) removing abrasive grains from a surface of the semiconductor wafer by dipping the semiconductor wafer and the slicing plate in a removing abrasive grain solution; and thereafter (f) separating the semiconductor wafer from the slicing plate, wherein the abrasive grain removal-cleaning step is performed by using an alkaline aqueous solution containing 0.5% to 3.0% of an anionic surface active agent as a cleaning fluid of the alkali cleaning for abrasive grain removal.

7. The method of producing a semiconductor wafer according to claim 6, wherein the abrasive grain removal-cleaning step is performed by setting a temperature of the cleaning fluid of the alkali cleaning for abrasive grain removal within a range between 50° C. and 90° C.

8. The method of producing a semiconductor wafer according to claim 6, further comprising an air blow step of blowing air to the semiconductor wafer which has been lifted up from at least one of cleaning baths.

9. The method of producing a semiconductor wafer according to claim 6, wherein at least one of the degrease-cleaning step and the rinse-cleaning step, is conductor while performing bubbling.

10. The method of producing a semiconductor wafer according to claim 6, wherein at least one of the degrease-cleaning step and the oil-water separation-cleaning step has a lifting step of lifting up the semiconductor wafer once from the cleaning bath then draining from the semiconductor wafer.

* * * * *